United States Patent
Tsai et al.

[19]

[11] Patent Number: 6,159,819
[45] Date of Patent: Dec. 12, 2000

[54] FABRICATION OF CAPACITORS WITH LOW VOLTAGE COEFFICIENT OF CAPACITANCE

[75] Inventors: Ching-Huei Tsai, ChiaYi; Horn-Jaan Lin, KaoHsiung; Chun-Hsien Fu, Hsinchu, all of Taiwan

[73] Assignee: United Microelectronics Corp., Hsinchu, Taiwan

[21] Appl. No.: 09/002,729

[22] Filed: Jan. 5, 1998

[30] Foreign Application Priority Data

Oct. 21, 1997 [TW] Taiwan ................. 861165509

[51] Int. Cl.$^7$ .................................. H01L 21/20
[52] U.S. Cl. ................... 438/394; 438/251; 438/252; 438/393; 438/395
[58] Field of Search .................. 438/239, 243, 438/244, 247, 252, 253, 381, 386, 387, 393, 396, 398, 399, 210, 251, 394, 395

[56] References Cited

U.S. PATENT DOCUMENTS 5,338,701  8/1994  Hsu et al. ................. 437/60

OTHER PUBLICATIONS

S.Wolf, Silicon Processing For The VLSI Era, vol. 1, pp. 181–182, 1986.

*Primary Examiner*—Donald L. Monin, Jr.
*Assistant Examiner*—Hoai Pham

[57] ABSTRACT

A method of fabricating of a capacitor with low voltage coefficient of capacitance is described. A silicon substrate with field oxide isolations is provided. A buried layer is formed by doping N-type impurities into the substrate as the bottom plate of the capacitor. A dielectric layer is formed by thermal oxidation for the capacitor, and then a polysilicon layer is formed by the low pressure chemical vapor deposition method. A thermal diffusion step is performed to dope phosphorus into the polysilicon layer. After formation of a polysilicide layer by the low pressure chemical vapor deposition method, arsenic ions are implanted into the polysilicon layer and the polysilicide layer. Finally the polysilicide layer and the polysilicon layer are partially etched in consequence, and the top plate of the capacitor is formed.

16 Claims, 5 Drawing Sheets

FABRICATION OF CAPACITORS WITH LOW VOLTAGE COEFFICIENT OF CAPACITANCE

BACKGROUND OF THE INVENTION (1) Field of the Invention

The present invention relates to a method of fabricating capacitors of integrated circuits, and more particularly to the buried N+silicon-to-polysilicide capacitors with low voltage coefficient of capacitance(hereinafter referred as VCC) of high density ICs.

(2) Description of the Related Art

A mixed-mode circuit includes logic circuits and analog circuits. A capacitor is one of the most important devices in the mixed-mode circuit and the voltage coefficient of capacitance is a key parameter to determine the operation performance of a capacitor. For the actual application to the IC manufacture, the VCC value is generally demanded to be less than 100 ppm/V.

The definition of the voltage coefficient of capacitance is the partial derivative of capacitance relative to voltage per standard capacitance. Please refer to the following formula:

$$VCC = \frac{\partial C}{\partial V} \frac{1}{C_0} \text{ (ppm/V)}$$

For the early mixed-mode process, the VCC values of obtained capacitors are generally less than 50 ppm/V, and match the specification of IC manufacturers. However, in recent years, the cell amount of ICs has been enhanced significantly, and the packing densities of ICs have been increasing considerably. In order to achieve high packing density, the cell sizes of ICs cell must be shrunk. As the sizes of the capacitors become smaller, the capacitance values of the capacitors are decreasing and the VCC values are dramatically increasing, causing the performance problem.

FIG. 1 shows a cross-sectional view of a conventional buried N+silicon-to-polysilicide capacitor. The process steps are briefly described as follows: A silicon substrate 1 with field oxide isolations 2 is provided. A buried layer 5 is formed by doping N-type impurities into the substrate 1 as the bottom plate of the capacitor. A dielectric layer 6 is then formed by thermal oxidation for the capacitor, and then a polysilicon layer 7 and a polysilicide layer 8 are formed by the low pressure chemical vapor deposition (LPCVD) method in consequence. Finally the polysilicide layer 8 and the polysilicon layer 7 are partially etched in consequence, and then the top plate 9 of the capacitor is formed.

The wafer numbers 1–3 of FIG. 2a show the capacitors formed by the conventional process with plate size 100*100 $\mu m^2$ having VCC values between 132 and 334 ppm/V, all of which are much higher than the application standard value 100 ppm/V. The wafer numbers 1–3 of FIG. 2b show the capacitors formed by the conventional process with plate size 40*40 $\mu m^2$ having VCC values between 148 and 2538 ppm/V, which are also much higher than the application standard value 100 ppm/V.

The present invention discloses a new method to fabricate a buried N+silicon-to-polysilicide capacitor with low voltage coefficient of capacitance.

SUMMARY OF THE INVENTION

Accordingly, it is a primary object of the present invention to provide a method of fabricating a buried N+silicon-to-polysilicide capacitor with low voltage coefficient of capacitance(VCC).

It is another object of the present invention to provide a capacitor structure with low VCC for mixed mode IC applications.

In accordance with the objects of this invention, there is shown a method of fabricating a IC's capacitor. A silicon substrate, having field oxide isolations which define a capacitor region, is provided. A buried conducting layer is formed by doping N-type impurities into the substrate as the bottom plate of the capacitor. A dielectric layer is formed by thermal oxidation for the capacitor, and then a polysilicon layer is formed by the low pressure chemical vapor deposition method. Thereafter, a thermal diffusion step is performed to dope phosphorus into the polysilicon layer at a temperature range from 800° C. to 950° C. After forming of a polysilicide layer by the low pressure chemical vapor deposition method, arsenic ions are then implanted into the polysilicon layer and the polysilicide layer, in order to increase the dopant concentration of the capacitor's top plate and thus lower the VCC value of the capacitor. Finally the polysilicide layer and the polysilicon layer are partially etched in consequence, and the top plate of the capacitor is formed.

BRIEF DESCRIPTION OF THE DRAWINGS

The accompanying drawings forming a material part of this description, in which.

DESCRIPTION OF THE PREFERRED EMBODIMENT

Figure 3:
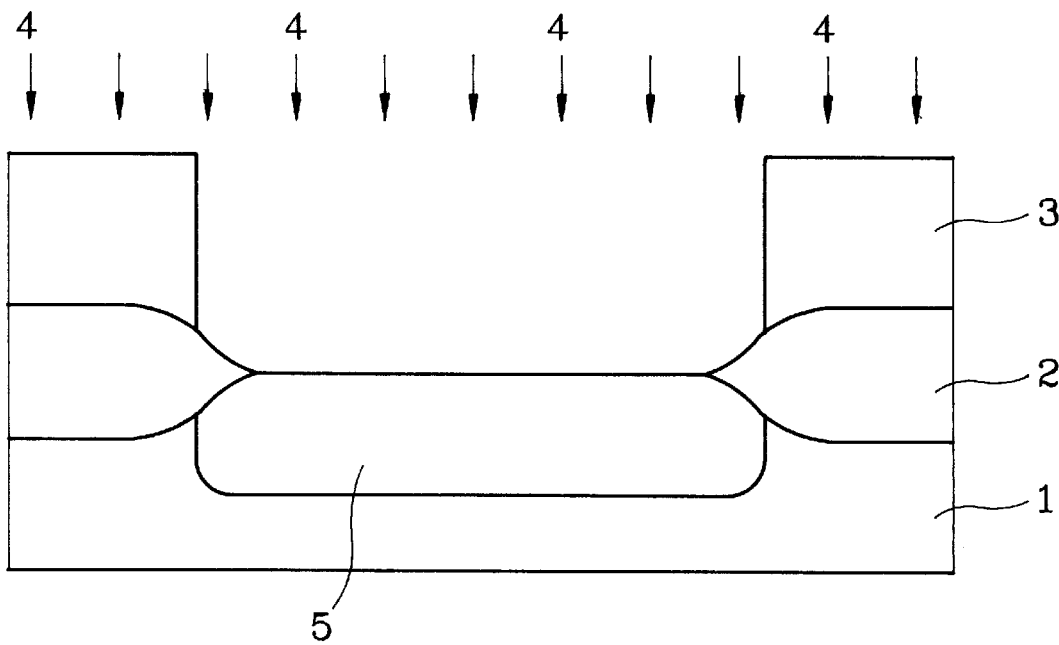
FIG. 3 is a cross sectional view showing a bottom plate of the capacitor is formed, in accordance with the present invention.

Referring now in detail to the drawings for the purpose of illustrating preferred embodiments of the present invention, the process for fabricating capacitors with low voltage coefficient as shown in FIGS. 3 to 8 comprises the following steps:

FIG. 3 shows a forming step of a buried layer in a silicon substrate 1 as the bottom plate of a capacitor. A silicon substrate, having field oxide isolation, is provided. A photo resist 3 is spread and then a capacitor region is defined. Thereafter, N-type ions 4 such as arsenic are implanted into the substrate at an energy level from 60 keV to 120 keV, and a dose in the range from 2E14 cm$^{-2}$ to 5E15 cm$^{-2}$, and the bottom plate of the capacitor is formed.

Figure 4:
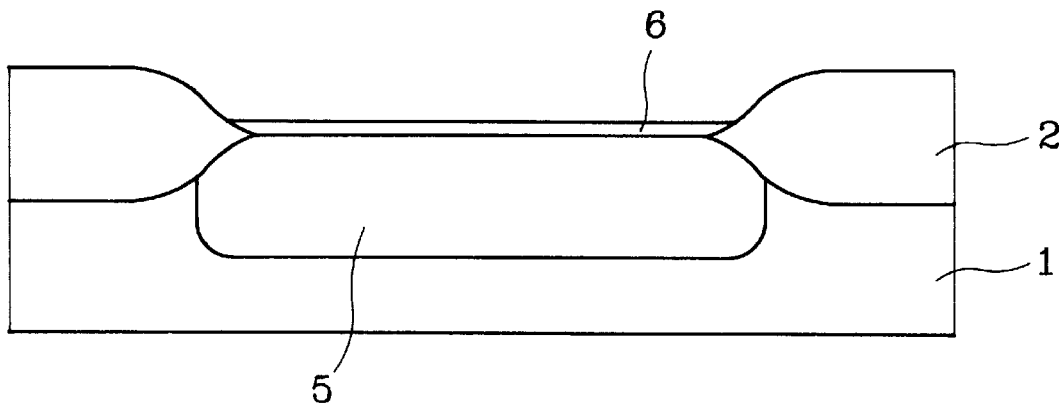
FIG. 4 is a cross sectional view showing a dielectric layer is formed on the bottom plate of FIG. 3.

FIG. 4 shows a forming step of a dielectric layer 6 on said silicon substrate 1 for the capacitor. The dielectric layer is formed to a thickness of about 100–750 Angstroms by thermal oxidation at a temperature range from 750° C. to 950° C.

Figure 5:
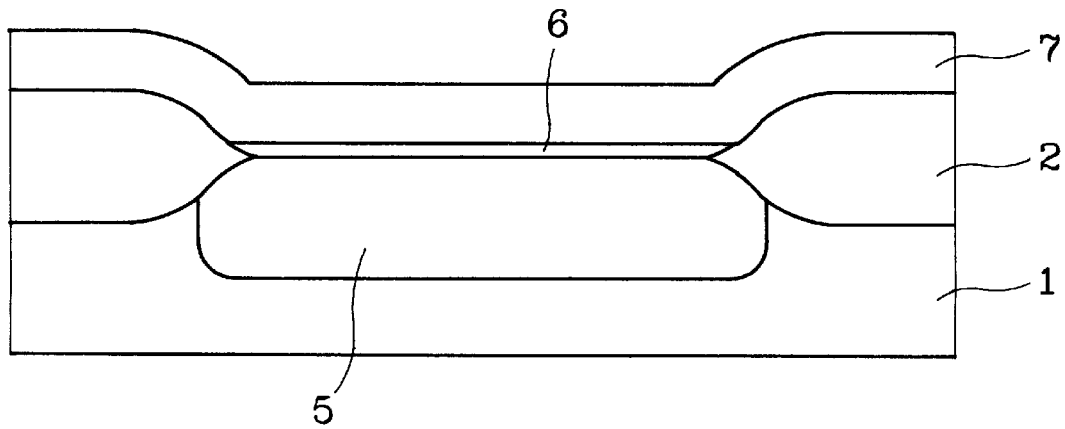
FIG. 5 is a cross sectional view showing a polysilicon layer is formed on the dielectric layer of FIG. 4.

FIG. 5 shows a depositing step of a polysilicon layer 7 on the dielectric layer 6. The polysilicon layer is formed to a thickness of about 1000–2500 Angstroms by the low pressure chemical vapor deposition method. Thereafter, a thermal diffusion step is performed to dope phosphorus into the polysilicon layer at a temperature range from 800° C. to 950° C.

The purpose of the thermal diffusion is to lower the sheet resistance of the polysilicon layer 7, and the higher the dose, the lower the sheet resistance of the polysilicon is. The dose of the thermal diffusion is controlled to obtain the sheet resistance of the polysilicon layer 7 in a range of 30Ω per square to 50Ω per square.

Figure 6:
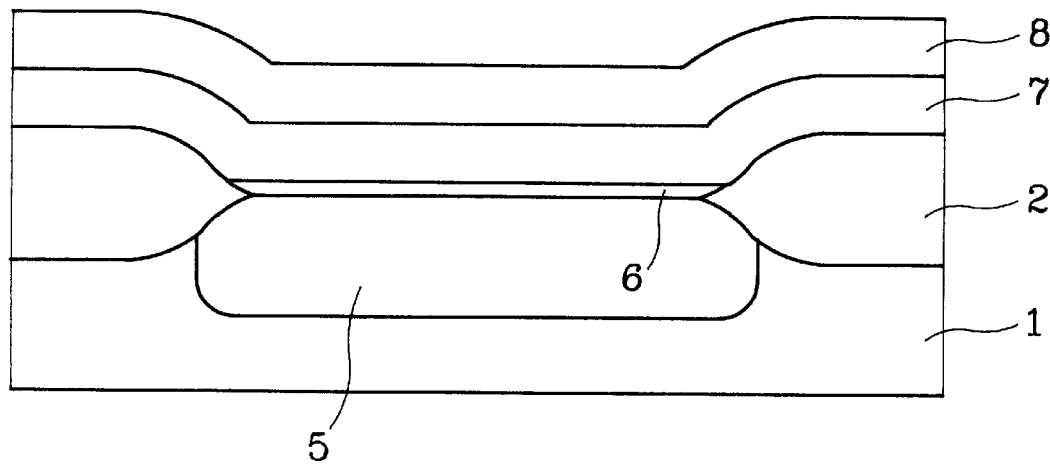
FIG. 6 is a cross sectional view showing a polysilicide layer is formed on the polysilicon layer of FIG. 5.

FIG. 6 shows a depositing step of a polysilicide layer 8 on the polysilicon layer 7. The polysilicide layer 8 is formed to a thickness of about 1500–2500 Angstroms by the low pressure chemical vapor deposition method. The polysilicon layer 7 and the polysilicide layer 8 are prepared for being patterned as the top plate of the capacitor. The purpose of the polysilicide layer is to lower the resistance of the capacitor's top plate.

Figure 7:
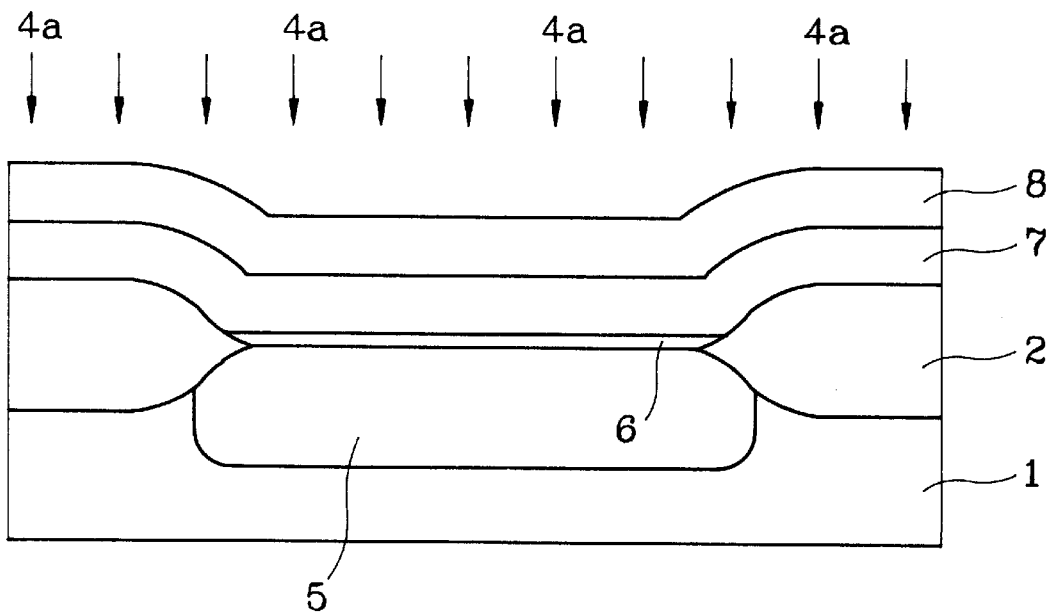
FIG. 7 is a cross sectional view showing N-type ions are implanted into the polysilicon layer of FIG. 5 and the polysilicide layer of FIG. 6.

FIG. 7 shows a doping step, the most importance step of the present invention. Arsenic ions 4a are implanted into the polysilicon layer and the polysilicide layer at an energy level from 60 keV to 120 keV, and a dose in a range from 5E15 cm$^{-2}$ to 1E16cm$^{-2}$. The purpose of this step is to increase the dopant concentration of the capacitor's top plate and thus lower the VCC of the capacitor.

Figure 8:
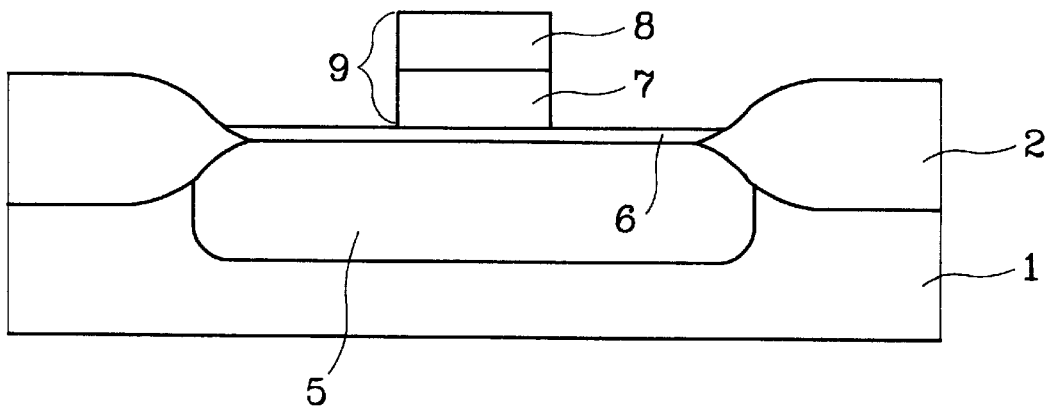
FIG. 8 is a cross sectional view showing a top plate of the capacitor is formed.

FIG. 8 shows a patterning step of the top plate 9 of the capacitor. After the capacitor region is defined, the polysilicide layer 8 and the polysilicon layer 7 are etched in consequence except the capacitor region.

Figure 1:
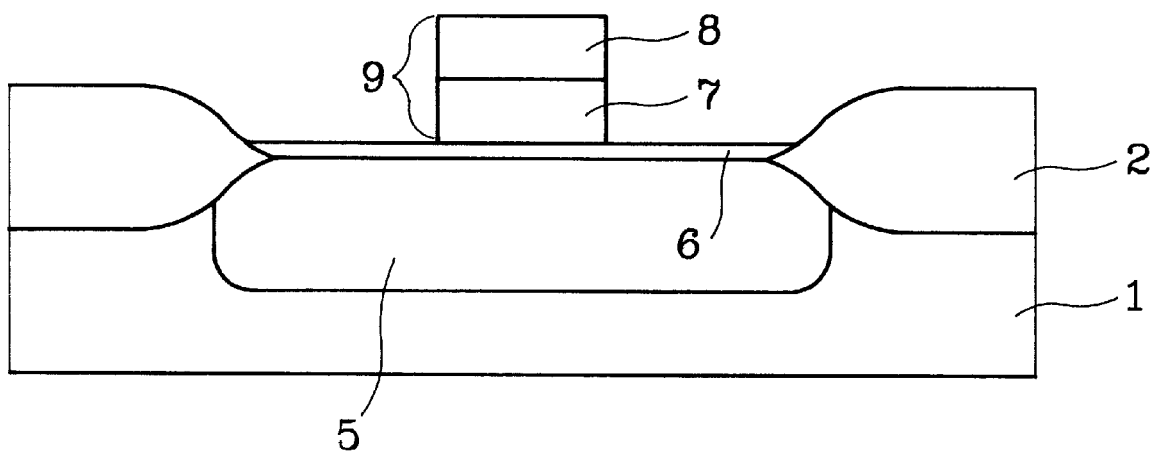
FIG. 1 is a cross sectional representation of the capacitor made by the conventional art.
Figure 2A:
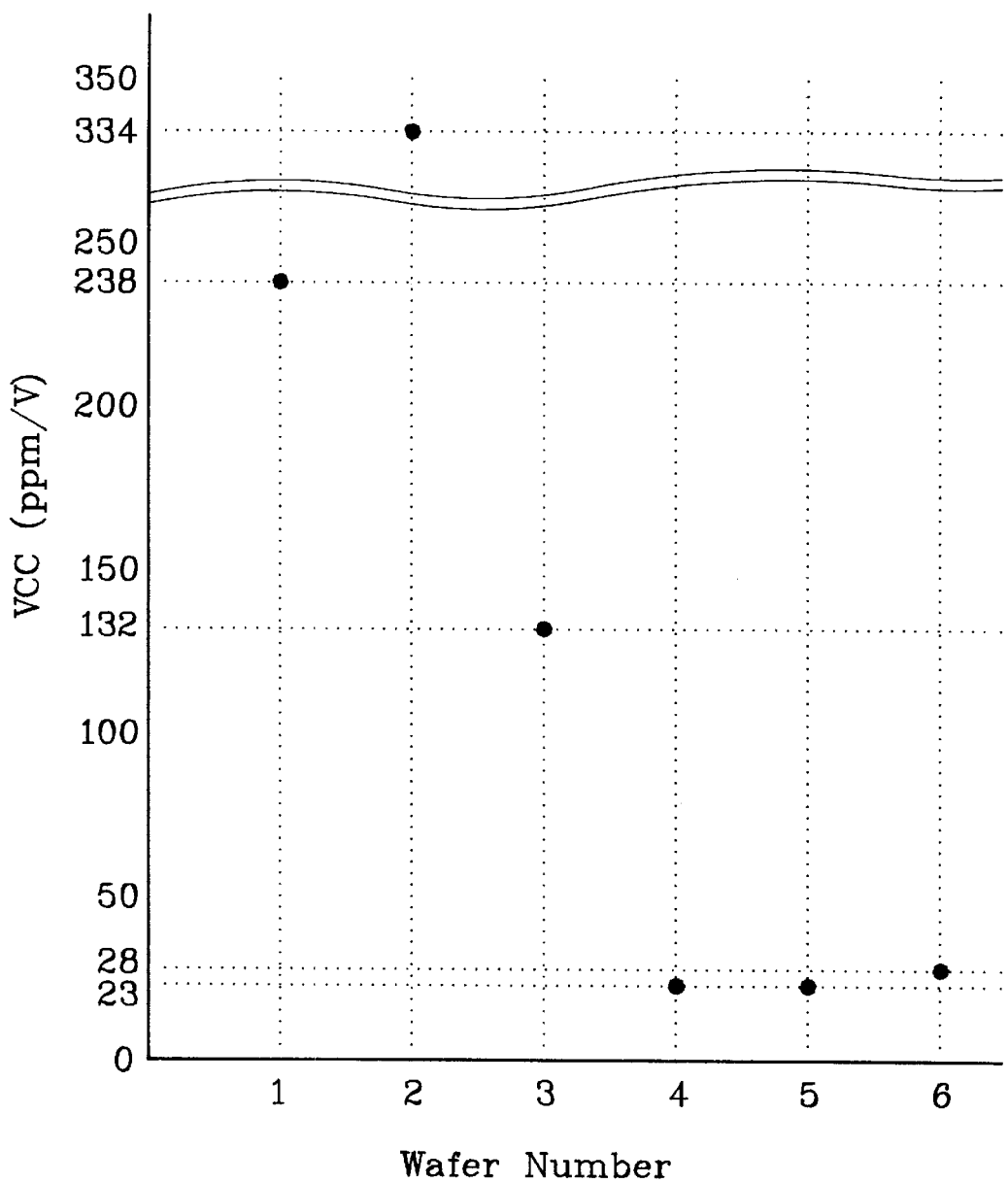
FIG. 2a is a VCC comparison diagram between the conventional art and this invention about the capacitors with plate area 100*100 $\mu m$.
Figure 2B:
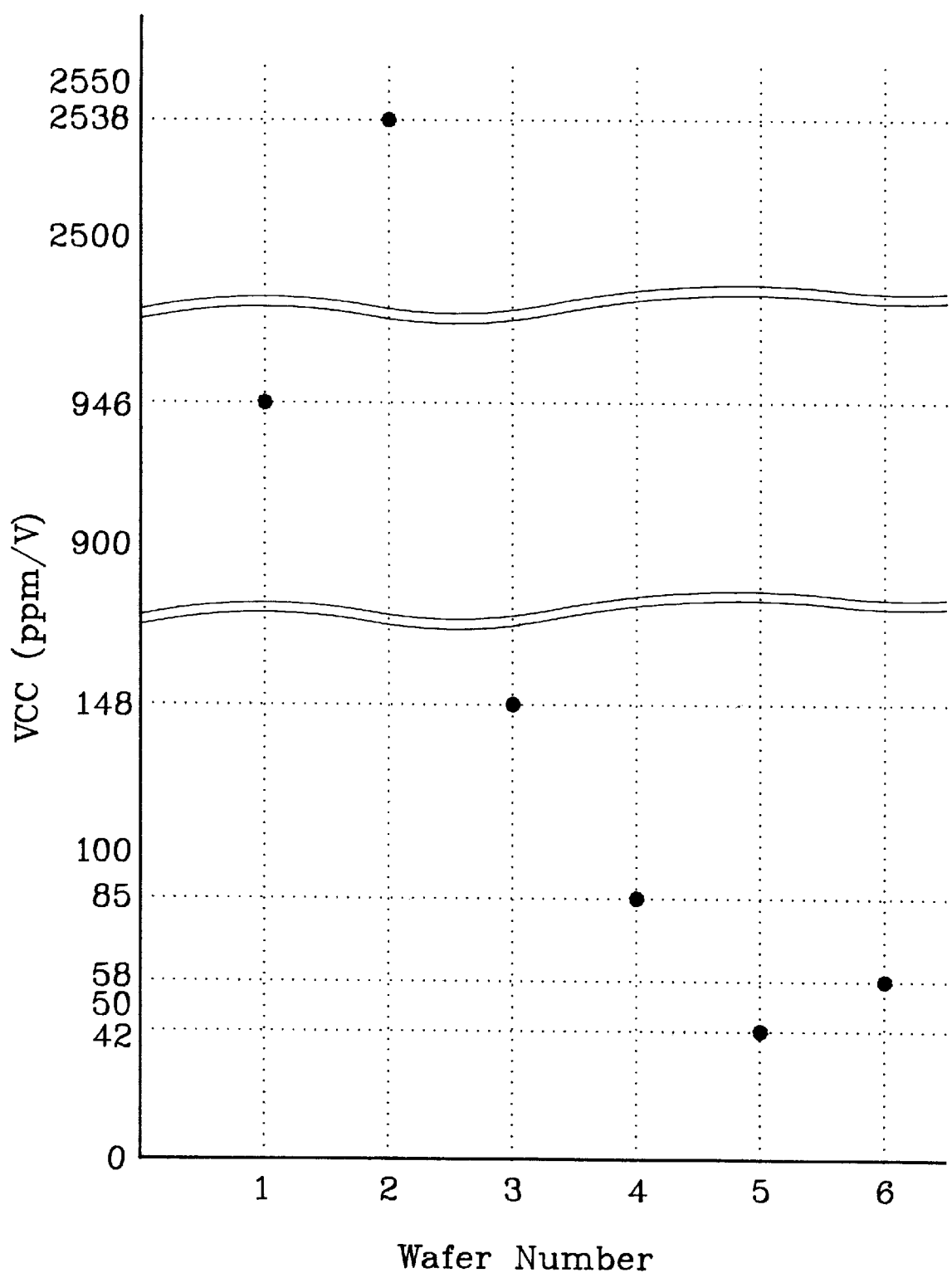
FIG. 2b is a VCC comparison diagram between the conventional art and this invention about the capacitors with plate area 40*40 $\mu m$.

The different VCC performances between the conventional art and the present invention are shown in FIG. 2a and FIG. 2b. FIG. 2a shows the VCC values of capacitors with plate size 100*100 $\mu$m$^2$. The wafer numbers 1–3 of FIG. 2a are formed by using the conventional art and the wafer numbers 4–6 are formed by the process according to the present invention. As shown in FIG. 2a, the VCC values of capacitors formed by using the conventional art are between 132 and 334 ppm/V, but the VCC values of capacitors formed by the process according to the present invention are only between 23 and 28 ppm/V. FIG. 2b shows the VCC values of capacitors with plate size 40*40 $\mu$m$^2$. The wafer numbers 1–3 of FIG. 2b are formed by using the conventional art and wafer numbers 4–6 are formed by using by the present invention. As shown in FIG. 2b, the VCC values of capacitors formed by using the conventional art are between 148 and 2538 ppm/V, while the VCC values of capacitors formed by using the present invention are only between 42 and 85 ppm/V.

Therefore, as shown in FIG. 2a and FIG. 2b, the present invention makes a great improvement about the performance of the capacitors, whose VCC values are much lower than the standard value 100 ppm/V.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What we claimed is:

1. A method for fabricating a N+silicon-to-polysilicide capacitor with low voltage coefficient of capacitance, comprising the steps of:

(a) forming a bottom plate for the capacitor by implanting N+ ions into a silicon substrate;

(b) forming a dielectric layer on said silicon substrate;

(c) forming a polysilicon layer over said dielectric layer;

(d) doping ions of N-type impurities to said polysilicon layer;

(e) depositing a polysilicide layer over said polysilicon layer;

(f) implanting ions of N-type impurities to said polysilicon layer and said polysilicide layer; and (g) forming a top plate for the capacitor by patterning said polysilicon layer and said polysilicide layer.

2. The method of claim 1, wherein said buried layer is formed by ions implanting N-type impurities.

3. The method of claim 2, wherein said N-type impurities are arsenic As75.

4. The method of claim 3, wherein said arsenic is implanted with an implant energy between 60 Kev and 120 Kev.

5. The method of claim 3, wherein said arsenic is implanted into said substrate at a dose in the range of 2E14 cm$^{-2}$ to 5E15 cm$^{-2}$.

6. The method of claim 1, wherein said dielectric layer is formed by thermal oxidation.

7. The method of claim 6, wherein said thermal oxidation is performed at a temperature range of 750° C. and 950° C.

8. The method of claim 1, wherein said dielectric layer has a thickness of 100 to 750 Angstroms.

9. The method of claim 1, wherein said polysilicon layer has a thickness of 1000 to 2500 Angstroms.

10. The method of claim 1, wherein said doping ions of N-type impurities is using thermal diffusion.

11. The method of claim 10, wherein said thermal diffusion is performed at a temperature range between 800° C. to 950° C.

12. The method of claim 10, wherein said thermal diffusion is performed at a dose letting the sheet resistance of said polysilicon in a range of 30Ω per square to 50Ω per square.

13. The method of claim 1, wherein said polysiliside layer has a thickness of 1000 to 2500 Angstroms.

14. The method of claim 1, wherein said ions implanting N-type impurities is using arsenic As75.

15. The method of claim 14, wherein said arsenic is implanted with an implant energy between 60 Kev and 120 Kev.

16. The method of claim 14, wherein said arsenic is implanted into said substrate at a dose in the range of 5E15 cm$^{-2}$ to 1E16 cm$^{-2}$.

* * * * *